United States Patent
Yamamoto et al.

(10) Patent No.: US 6,271,601 B1
(45) Date of Patent: Aug. 7, 2001

(54) WIRE BONDING METHOD AND APPARATUS AND SEMICONDUCTOR DEVICE

(75) Inventors: Noriaki Yamamoto, Fujisawa; Yukinori Taneda, Yokohama; Hirohisa Yamamura, Hitachioota; Akio Yasukawa, Kashiwa; Osamu Suzuki, Niihari-gun; Tatsuya Shigemura, Hitachinaka, all of (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/305,448

(22) Filed: May 6, 1999

(30) Foreign Application Priority Data

May 12, 1998 (JP) .................................................. 10-128586

(51) Int. Cl.[7] .................................................. H01L 23/48
(52) U.S. Cl. ...................... 257/784; 257/775; 228/110.1; 228/104; 438/18
(58) Field of Search .................................. 257/784, 775, 257/776, 674, 698; 228/110.1, 111, 135, 104; 438/18

(56) References Cited

U.S. PATENT DOCUMENTS

| | | | |
|---|---|---|---|
| 3,747,198 | * 7/1973 | Benson et al. ........................ 29/504 |
| 3,954,217 | * 5/1976 | Smith .................................. 29/470.1 |
| 4,777,579 | * 10/1988 | Jahns et al. ............................ 363/98 |
| 5,031,821 | * 7/1991 | Kaneda et al. ....................... 228/110 |
| 5,054,680 | * 10/1991 | Stockham ............................. 228/104 |
| 5,314,105 | * 5/1994 | Farassat ............................... 228/102 |
| 5,884,835 | * 3/1999 | Kajiwara et al. ................. 228/110.1 |
| 5,891,745 | * 4/1999 | Dunaway et al. ...................... 438/18 |
| 5,894,981 | * 4/1999 | Kelly .................................... 228/104 |
| 6,087,201 | * 7/2000 | Takahashi et al. .................. 438/106 |

FOREIGN PATENT DOCUMENTS 6244230    2/1994   (JP).

* cited by examiner

Primary Examiner—Don Wong
Assistant Examiner—Tuyet T. Vo
(74) Attorney, Agent, or Firm—Antonelli, Terry, Stout & Kraus, LLP

(57) ABSTRACT

A wire bonding method and apparatus implement the flatly thinner plastic deformation for the joint section of a wire, which has a diameter ranging 100–600 μm, on its feed side, feed out and position the flatly deformed wire joint section to a target joint surface, and join the wire to it by pressing the positioned wire joint section, with vibration being applied, onto the joint surface with a ultrasonic wire bonder. A high-power semiconductor device fabricated based on this scheme has a long life of wire joints.

14 Claims, 11 Drawing Sheets

A-A SECTION

FIG. 5
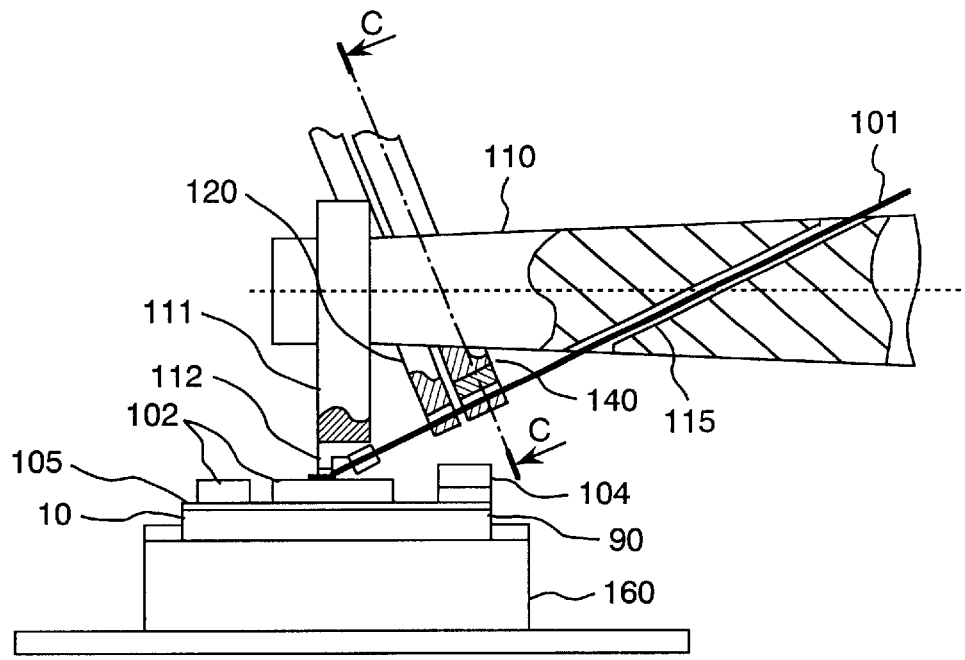
FIG. 6A
FIG. 6B
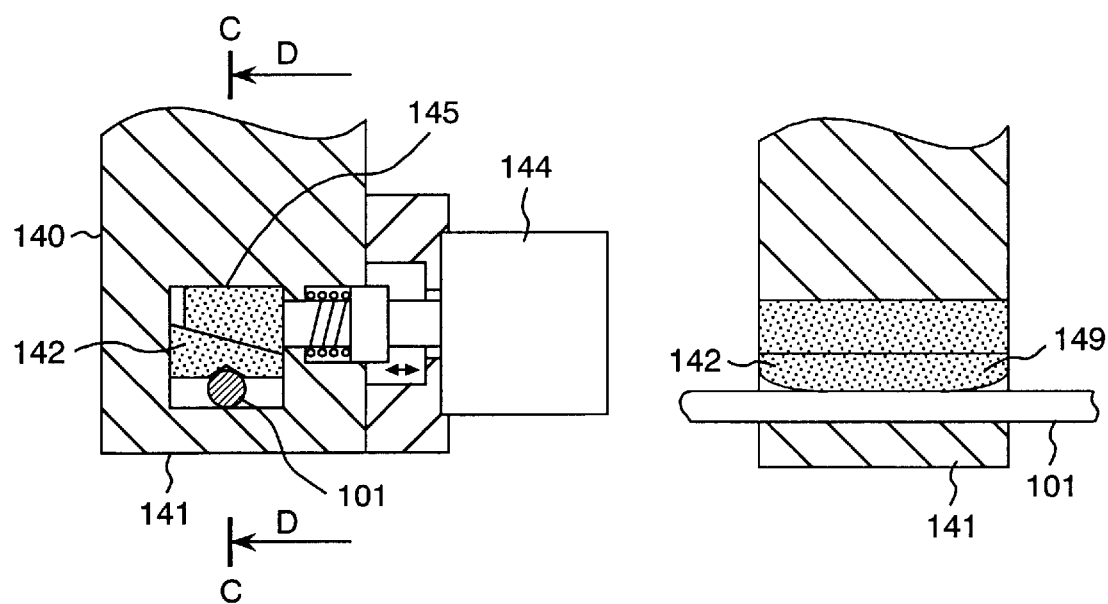

142a — 142, 142A   141, 141A 112
112a

142b — 142, 142A   141, 141A 112
112b

FIG. 11A                    FIG. 11B
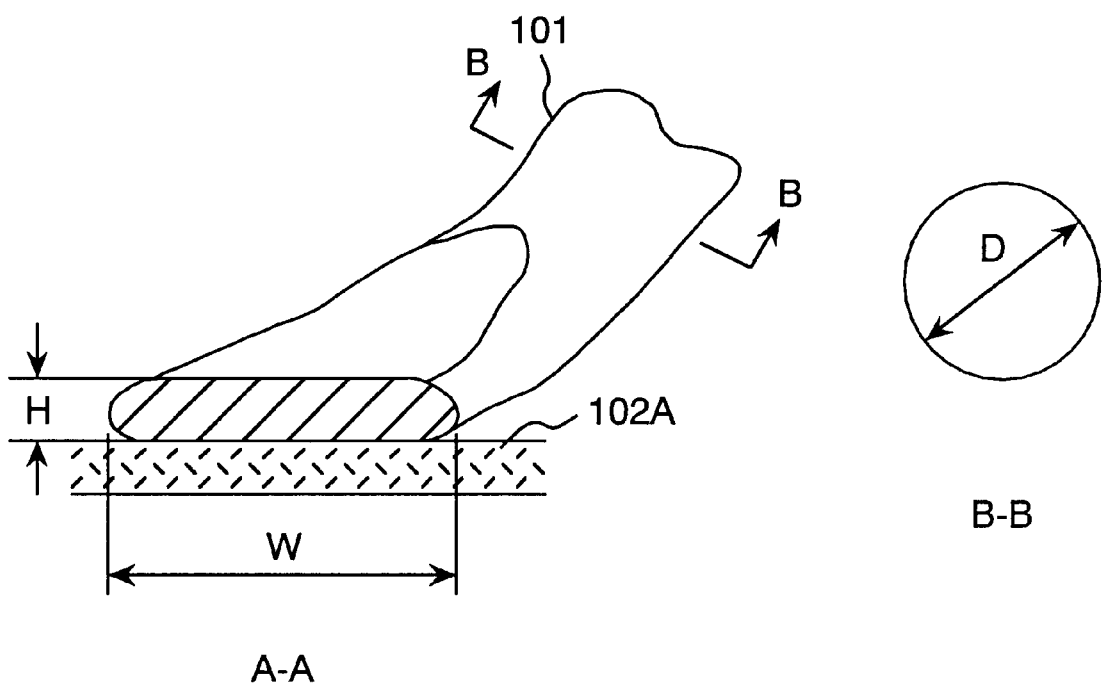

ly deformed wire joint section to the target joint surface, and pressing the positioned wire joint section, with vibration being applied, onto the target joint surface with a ultrasonic wire bonder. Preferred wire diameters range from 100 to 600 μm.

WIRE BONDING METHOD AND APPARATUS AND SEMICONDUCTOR DEVICE

BACKGROUND OF THE INVENTION

1. Field of the Invention

The present invention relates to a wire bonding method and apparatus for interconnecting electronic parts by using electrically conductive wires, and to a semiconductor device. Particularly, the inventive method and apparatus are applied suitably to semiconductor devices which are intended for high-speed switching of large currents in automobile equipment controllers, electric-car drive controllers and other vehicle-installed motor controllers.

2. Description of the Prior Art

In the manufacturing process of semiconductor devices which include multiple semiconductor chips and electronic parts, a scheme of wire bonding is used for the electrical connection between the electrodes of semiconductor chips and electronic parts and between the terminals of electronic parts.

A typical conventional wire bonding apparatus will be explained first with reference to FIG. 14. FIG. 14 is a side view of the conventional wire bonding apparatus. This wire bonding apparatus is designed to feed a wire 101, which is supplied from a bobbin (not shown), to the groove of wire press section 112 of a bonding tool 111 by way of a through-hole 115 formed in a horn 110 and a gap of clamp section of a wire clamp mechanism 120.

With ultrasonic vibration being applied to the bonding tool 111 which is fixed to the tip section of the horn 110, the wire 101 is pressed onto the electrode of a semiconductor chip 102 as one part of connection so that the wire 101 is joined to it, and next the wire 101 is fed and brought by the bonding tool 111 to the terminal 104 of another electronic part, e.g., a resistor, as another part of connection and joined to it in the same manner.

The wire clamp mechanism 120 is located between the wire press section 112 of the bonding tool 111 and the through-hole 115 of the horn 110, and it serves to hold and guide the wire 101 when it is fed out. The bonding tool 111 and horn 110 are supported on a vertical moving mechanism and horizontal moving table so that they can move vertically and horizontally relative to the semiconductor chip 102 and electronic part.

Automobile equipment controllers and electric-car drive controllers are required to be made much smaller in size and weight. The drive controller incorporates semiconductor devices which implements high-speed switching of large currents for producing a.c. power for driving motors by being supplied with power from such a d.c. power source as battery.

Electronic components have their operating currents increasing to match with the trend of higher-power drive controllers, and therefore wires of large diameters are used for the electrical connection between semiconductor chips and between semiconductor chips and electronic parts of semiconductor devices. For wires of large diameters, aluminum wires which are inexpensive and light are used, instead of wires having higher electrical conductivity that mainly consist of expensive gold. Aluminum wires are thicker due to the lower electrical conductivity than gold wires, and aluminum wires with diameters of 100–600 μm are necessary for high-power semiconductor devices.

Semiconductor devices used in automobile equipment controllers and electric-car drive controllers are required to be durable against severe heat cycles and power cycles thereby to last long, in addition to the demand of compactness and light weight. In order to meet these requirements, it is necessary to improve the strength of wire joints.

There is a limit in widening the joint area based merely on pressing the wire 101 having a circular cross section onto the planar target joint surface, and there is also a limit in improving the strength and life of joints based merely on the application of ultrasonic vibration to the limited joint area. Specifically, the conventional wire bonding scheme works for joining by pressing the wire 101 having a circular cross section onto a planar target joint surface so that the wire is deformed, and the pressing force needs to be increased progressively to overcome the increasing resistance of deformation.

Accordingly, in order for the conventional wire bonding scheme to improve the strength and life of wire joints by raising the degree of deformation of the wire 101 while retaining the mechanical strength of the deformed section of the wire 101, it is necessary to increase the ultrasonic output for the metallic joint process thereby to increase the pressing force of the wire 101. However, an excessive pressing force by the increased ultrasonic output can result in the breakage of the electronic part or semiconductor chip 102 having the target joint surface.

On this account, conventionally, there is a limit in widening the joint area, and thus there is a limit in improving the strength and life of wire joints.

SUMMARY OF THE INVENTION

The present invention is intended to overcome the foregoing prior art deficiency, and its prime object is to provide a wire bonding method and apparatus capable of accomplishing wire joints which are durable against severe heat cycles and power cycles thereby to have a long life, and are useful for semiconductor devices which implement high-speed switching of large currents.

Another object of the present invention is to provide a high-power semiconductor device which is smaller in size and weight and durable against severe heat cycles and power cycles thereby to have a long life based on the enhanced strength of wire joints.

In order to achieve the above objective, the inventive wire bonding method comprises a step of implementing the flatly thinner plastic deformation for the joint section of a wire on the feed side thereof, and a step of joining the wire to a target joint surface by feeding out and positioning the flatly deformed wire joint section processed by the wire deforming step to the target joint surface, and pressing the positioned wire joint section, with vibration being applied, onto the target joint surface with a ultrasonic wire bonder. Preferred wire diameters range from 100 to 600 μm.

Alternatively, the inventive wire bonding method comprises a step of implementing the flatly thinner plastic deformation for the joint section of a wire on the feed side thereof to match with the intended length of wire loop, and a step of joining the wire to a target joint surface by feeding out and positioning the flatly deformed wire joint section processed by the wire deforming step to the target joint surface, and pressing the positioned wire joint section, with vibration being applied, onto the target joint surface with a ultrasonic wire bonder. Preferred wire diameters range from 100 to 600 μm.

Wires used for the inventive wire bonding method are preferably made of aluminum or aluminum alloy.

Preferably, the wire deforming step of the inventive wire bonding method implements the flatly thinner plastic deformation for the joint section of the wire at a ratio of 2 or more in terms of deformation factor W/D, where W is the width of deformed wire at the joint section and D is the original wire diameter.

Preferably, the wire joining step of the inventive wire bonding method joins the joint section of the wire to the target joint surface at a deformation factor W/D of a ratio 2 or more, where W is the width of deformed wire at the joint section and D is the original wire diameter.

More preferably, the wire joining step of the inventive wire bonding method joins the joint section of the wire to the target joint surface at a deformation factor W/D of a ratio in the range from 4 to 6, where W is the width of deformed wire at the joint section and D is the original wire diameter.

In order to achieve the above objective, the inventive wire bonding apparatus comprises means of implementing the flatly thinner plastic deformation for the joint section of a wire on the feed side thereof, and means of joining the wire to a target joint surface by feeding out and positioning the flatly deformed wire joint section processed by the wire deforming means to the target joint surface, and pressing the positioned wire joint section, with vibration being applied, onto the target joint surface with a ultrasonic wire bonder.

The wire deforming means of the inventive wire bonding apparatus includes an upper mold and a lower mold, with one mold being moved to another mold by means of a driving device so that the wire is deformed. Preferably, the one mold has the formation of a V-shaped groove and has slope sections at its wire inlet and outlet. Preferably, the one mold has the formation of a flat groove and has slope sections at its wire inlet and outlet. Preferably, the joining means includes a wire press section having a V-shaped groove or a flat groove.

The inventive wire bonding apparatus comprises means of implementing the flatly thinner plastic deformation for the joint section of a wire, which has a diameter in the range from 100 to 600 µm, on the feed side thereof, and means of joining the wire to a target joint surface by feeding out and positioning the flatly deformed wire joint section processed by the wire deforming means to the target joint surface, and pressing the positioned wire joint section, with vibration being applied, onto the target joint surface with a ultrasonic wire bonder.

In order to achieve the above objective, the inventive semiconductor device has a wire joint surface of semiconductor chip, to which is joined a wire by ultrasonic wire bonding with the rendition of flatly thinner plastic deformation for the joint section of the wire at a ratio of 2 or more in terms of deformation factor W/D, where W is the width of deformed wire at the joint section and D is the original wire diameter.

Alternatively, the inventive semiconductor device has a wire joint surface of semiconductor chip, to which is joined a wire by ultrasonic wire bonding with the rendition of flatly thinner plastic deformation for the joint section of the wire at a ratio in the range from 4 to 6 in terms of deformation factor W/D, where W is the width of deformed wire at the joint section and D is the original wire diameter.

Preferred wire diameters D for these semiconductor devices range from 100 to 600 µm. Wires used for these semiconductor devices are preferably made of aluminum or aluminum alloy.

The inventive semiconductor device comprises a high-power semiconductor device, which includes a positive terminal and an output terminal which are fixed on an insulation substrate, a first power element and a second diode which are joined to the positive terminal, and a second power element and a first diode which are joined to the output terminal, and a negative terminal which is fitted on the insulation substrate through an insulator, with the first power element having its emitter electrode connected to the output terminal by wire bonding, the second diode having its anode electrode connected to the output terminal by wire bonding, the second power element having its emitter electrode connected to the negative terminal by wire bonding, and the first diode having its anode electrode connected to the negative terminal by wire bonding, wherein wires to be joined by ultrasonic wire bonding to the joint surfaces of the first and second power elements and the first and second diodes are rendered at the joint sections thereof with flatly thinner plastic deformation at a ratio of 2 or more in terms of deformation factor W/D, where W is the width of deformed wire at the joint section and D is the original wire diameter.

Alternatively, the inventive semiconductor device comprises a high-power semiconductor device, which includes a positive terminal and an output terminal which are fixed on an insulation substrate, a first power element and a second diode which are joined to the positive terminal, and a second power element and a first diode which are joined to the output terminal, and a negative terminal which is fitted on the insulation substrate through an insulator, with the first power element having its emitter electrode connected to the output terminal by wire bonding, the second diode having its anode electrode connected to the output terminal by wire bonding, the second power element having its emitter electrode connected to the negative terminal by wire bonding, and the first diode having its anode electrode connected to the negative terminal by wire bonding, wherein wires to be joined by ultrasonic wire bonding to the joint surfaces of the first and second power elements and the first and second diodes are rendered at the joint sections thereof with flatly thinner plastic deformation at a ratio in the range from 4 to 6 in terms of deformation factor W/D, where W is the width of deformed wire at the joint section and D is the original wire diameter.

Preferred wire diameters D for these high-power semiconductor devices range from 100 to 600 µm. Wires used for these high-power semiconductor devices are preferably made of aluminum or aluminum alloy.

According to the inventive wire bonding method and apparatus, it becomes possible to increase the joint area between the wire and the target joint surface without imposing an excessive ultrasonic output, pressing force and their application time length at the wire joining process, whereby it is possible to manufacture electronic components and semiconductor devices which are enhanced in the strength of wire joints and durable against severe heat cycles and power cycles thereby to have a long life.

The inventive wire bonding method and apparatus implement the prior wire deformation, so that the ultrasonic output, pressing force and their application time length can be reduced at the wire joining process, whereby it becomes possible to prevent the breakage of electronic parts including semiconductor chips and eventually manufacture reliable electronic components and semiconductor devices.

These and other features and advantages of the present description of preferred embodiments taken in conjunction with the accompanying drawings.

BRIEF DESCRIPTION OF THE DRAWINGS

FIGS. 4A, 4B and 4C are diagrams used to explain the improved strength and life of wire joints of the inventive semiconductor device, of which FIG. 4A is a plan view of a wire, FIG. 4B is a side view of the wire and electrode, and FIG. 4C is a cross-sectional view taken along the line A—A of FIG. 4B;

FIG. 5 is a brief side view of a wire bonding apparatus based on a first embodiment of this invention;

FIG. 6A is a cross-sectional view of the apparatus used to explain the wire pre-forming mechanism shown in FIG. 5, and FIG. 6B is a cross-sectional view taken along the line C—C and seen along the direction D of FIG. 6A;

FIG. 11A is a partially cross-sectional perspective view showing the joint of the wire joint section and target joint surface based on this invention, and FIG. 11B is a cross-sectional view taken along the line B—B of FIG. 11A;

DESCRIPTION OF THE PREFERRED EMBODIMENTS

Embodiments of the inventive wire bonding method and apparatus and semiconductor device will be explained with reference to the drawings.

Figure 1:
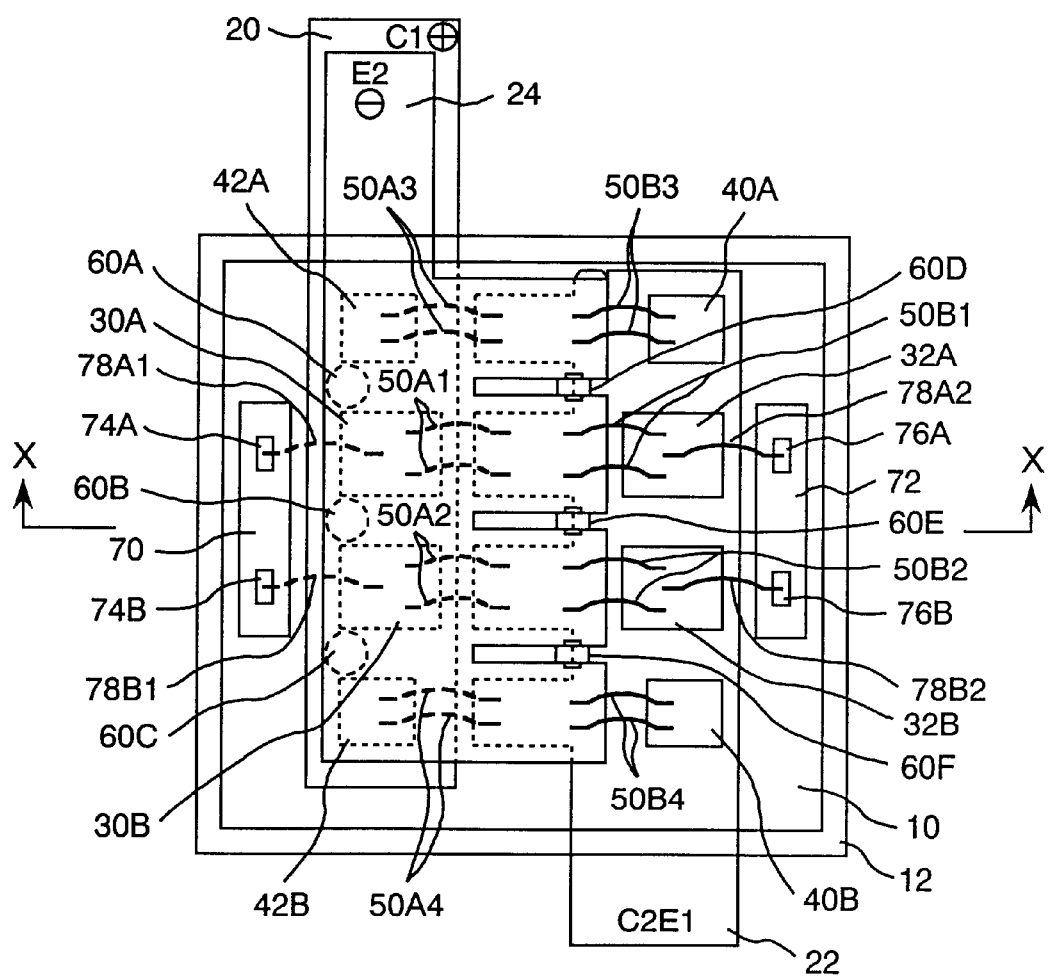
FIG. 1 is a plan view showing an embodiment of high-power semiconductor device to which the inventive wire bonding method is applied suitably.
Figure 2:
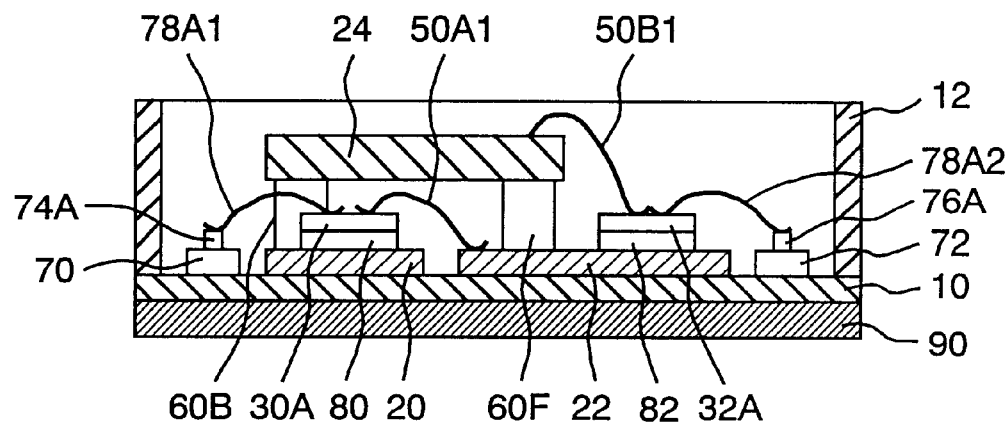
FIG. 2 is a cross-sectional view taken along the line X—X of FIG. 1.
Figure 3:
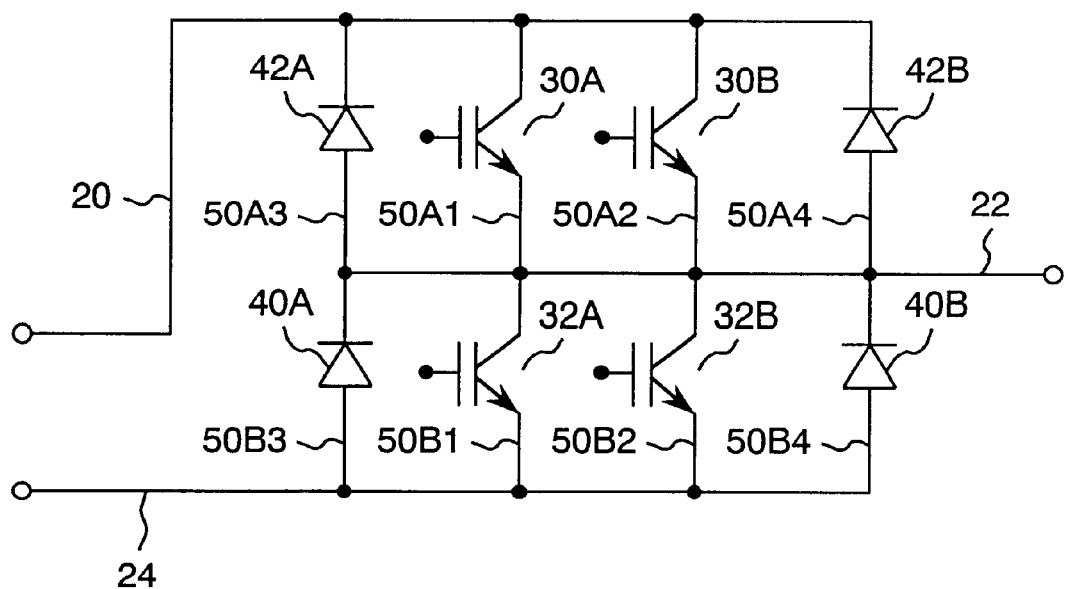
FIG. 3 is a schematic diagram showing the principal portion of the high-power semiconductor device shown in FIG. 1.

FIG. 1 is a plan view of a high-power semiconductor device based on an embodiment of this invention, FIG. 2 is a cross-sectional view taken along the line X—X of FIG. 1, and FIG. 3 is a schematic diagram showing the principal portion of this semiconductor device.

This semiconductor device is intended for high-speed switching of large currents for producing a.c. power for driving a motor by being supplied with power from such a d.c. power source as battery, as disclosed in Japanese Published Unexamined Patent Application No. Hei 9-102578.

In FIG. 1 through FIG. 3, a frame-shaped case 12 is fixed to an insulation substrate 10 which is made of aluminum nitride or the like. The insulation substrate 10 has on its rear side the attachment of a heat sink plate 90.

A positive terminal (connecting conductor) 20, output terminal 22 and negative terminal 24 are made of a material having a high electrical conductivity, such as copper or aluminum, and dimensioned so as to conduct a certain value of current at a low power loss. The positive terminal 20 and output terminal 22 are fixed to the insulation substrate 10 of aluminum nitride or the like by means of soldering of good heat dissipation or silver brazing.

First power switching elements 30A and 30B such as IGBT (Insulated Gate Bipolar Transistor) chips and second diodes 42A and 42B are soldered to the positive terminal 20, and second power switching elements 32A and 32B such as IGBT chips and first diodes 40A and 40B are soldered to the output terminal 22. The first power switching elements 30A and 30B have their emitter electrodes bonded to the output terminal 22 through wires 50A1 and 50A2, and the second diodes 42A and 42B have their anode electrodes bonded to the output terminal 22 through wires 50A3 and 50A4.

A negative terminal 24 is fixed on column-shaped insulators 60A–60F over the first power switching elements 30A and 30B and second diodes 42A and 42B in parallel to the positive terminal 20. The second power switching elements 32A and 32B have their emitter electrodes bonded to the negative terminal 24 through wires 50B1 and 50B2, and the first diodes 40A and 40B have their cathode electrodes bonded to the negative terminal 24 through wires 50B3 and 50B4.

On the insulation substrate 10, there is attached a terminal pad 70, on which gate resistors 74A and 74B are fixed. The gate resistors 74A and 74B are bonded to the base electrodes (formed of a material such as silicon) of the first power switching elements 30A and 30B of IGBTs or the like through wires 78A1 and 78B1, respectively. Further attached on the insulation substrate 10 is another terminal pad 72, on which gate resistors 76A and 76B are fixed. The gate resistors 76A and 76B are bonded to the base electrodes of the second power switching elements 32A and 32B of IGBTs or the like through wires 78A2 and 78B2, respectively.

In FIG. 2, indicated by 80 and 82 are solder for connecting the first power switching element 30A to the positive terminal 20 and connecting the second power switching element 32A to the output terminal 22, respectively.

The semiconductor device shown in FIG. 1 and FIG. 2 has a circuit arrangement as shown in FIG. 3. Common reference numerals are used throughout these figures. Specifically, the second diode 42A is connected between the positive terminal 20 and the output terminal 22 by the wire 50A3, and further connected between these terminals are the first power switching elements 30A and 30B by the wires 50A1 and 50A2, respectively, and the second diode 42B by the wire 50A4. The first diode 40A is connected between the output terminal 22 and the negative terminal 24 by the wire 50B3, and further connected between these terminals are the second power switching elements 32A and 32B by the wires 50B1 and 50B2, respectively, and the first diode 40B by the wire 50B4.

The circuit receives d.c. power on the positive terminal 20 and negative terminal 24, and produces a.c. power on the output terminal 22.

The wires 50A1–50A4, 50B1–50B4, etc. are connected by wire bonding. Because of the limited current capacity of a single wire for the connection between a power switching element or diode and other electronic part, multiple wires are generally used in parallel depending on the value of current flowing out of the power switching element or diode.

The foregoing circuit arrangement constitutes a semiconductor device which implements high-speed switching of large currents for driving a motor or the like by being supplied with power from a d.c. power source.

The wires 50A1–50A4, 50B1–50B4, 78A1, 78A2, 78B1 and 78B2 which conduct large currents are made of aluminum or aluminum alloy which includes silicon, nickel, etc. In case the electrical conductivity is major concern, wires of gold, silver or their alloys may be used.

In semiconductor devices in which electrodes of semiconductor chips and electronic parts are connected by wire bonding, the current flowing through each wire brings about the peel-off of joint between the wire and electrode, resulting in the heat concentration. The concentrated heat aggravates the peel-off of the joint. Therefore, it is required to prolong the device life attributable to power cycles which is dependent on the peel-off life of wire joints.

Figure 4A:
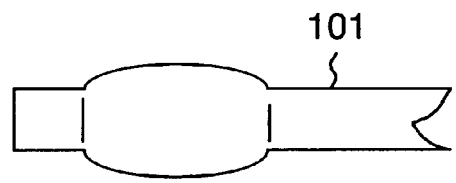

Next, the breakage of wire joint caused by power cycles will be explained with reference to FIGS. 4A–4C. FIG. 4A is a plan view of a wire, FIG. 4B is a side view of the wire and electrode, and FIG. 4C is a cross-sectional view taken along the line A—A of FIG. 4B.

Figure 4B:
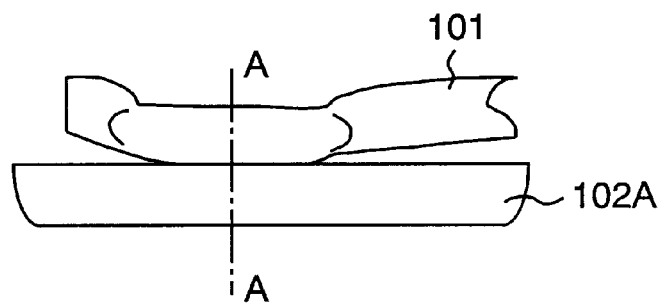
Figure 4C:
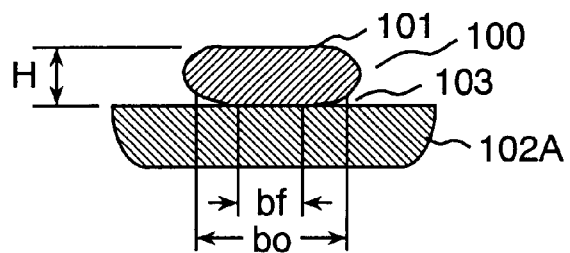

The wire 101 is rendered the flatly thinner plastic deformation in its portion to be joined to the electrode 102A so that it has an increased joint area, as shown in FIGS. 4A and 4B. With a ultrasonic vibration being applied, for example, the deformed joint section of the wire 101 is joined by wire bonding to the electrode 102A of a semiconductor chip or electronic part.

When a large current flows through the joint repeatedly, there emerges a crack 103 around the joint 100 between the wire 101 (50A1–50A4, 50B1–50B4, 78A1, 78A2, 78B1 and 78B2) and the electrode 102A as shown in FIG. 4B. The crack 103 progresses to reduce the connection area, resulting in an increased resistance of the joint 100 and eventually in the defective connection. Provided that the speed of progress of crack (the amount of progress of crack in a power cycle: da/dn) is virtually constant throughout the life, the life N of the joint 100 is formulated as follows.

$$N=(bo-bf)/(da/dn)/2 \quad (1)$$

where bo and bf are the original and final widths of the joint 100 as shown in FIG. 4C, and da/dn is the rate of progress of the amount of crack $\underline{a}$ with respect to the number of times of current conduction $\underline{n}$.

In the context of fracture mechanics, the term da/dn is dependent on the fracture mechanics parameter $\Delta J$ as follows.

$$da/dn=C_1 \cdot (\Delta J^m) \quad (2)$$

where $C_1$ and m are constants.

When the wire 101 in its portion of the joint 100 is modeled to be a film, the $\Delta J$ is proportional to the wire thickness H (shown in FIG. 4C) at the joint 100 as follows.

$$\Delta J=(\Delta \alpha \cdot \Delta T)^2 \cdot E \cdot H/(2-2v) \quad (3)$$

where $\Delta \alpha$ is the difference of linear expansion coefficients between the wire 101 and the power switching element 102 (30A, 30B, 32A, 32B, 40A, 40B, 42A and 42B), $\Delta T$ is the width of temperature variation, E is the Young's modulus of the wire 101, and v is the Poisson's ratio of the wire 101.

Based on the formulas (1) and (3), the influence of H on N is assessed by the following formula.

$$N=C_2/H^m \quad (4)$$

where $C_2$ is a constant.

In the case of the wire 101 of pure aluminum, m takes a value of around 1.4.

Accordingly, in order to enhance the strength and life of the joint 100, it is suggested to reduce the wire thickness H, or, in other words, increase the deformation factor W/D, where W is the width of deformed wire and D is the original wire diameter which is determined from the current capacity. The wire 101 of pure aluminum, which is inferior to gold in electrical conductivity, needs to be thicker than a gold wire, and its diameter D ranges from 100 to 600 µm for the foregoing high-power semiconductor device, for example.

Next, embodiments of the inventive wire bonding method and apparatus will be explained with reference to FIG. 5 through FIG. 7. FIG. 5 is a brief side view of the wire bonding apparatus based on the first embodiment of this invention.

This wire bonding apparatus includes a horn 110, on which is attached a bonding tool 111 having a wire press section 112 and functioning to press a wire 101 with a diameter of the 100–600 µm range, with vibration being applied, onto a target joint surface, e.g., the electrode 102A of semiconductor device, a wire pre-forming mechanism 140 which is located between the wire press section 112 of the bonding tool 111 and the through-hole 115 formed in the horn 110 and adapted to act the flatly thinner deformation on the wire 101 which is supplied from a supply reel (not shown) and fed through the through-hole 115 of the horn 110, a wire clamp mechanism 120 which clamps the wire 101, and a stage 160 which mounts an object of bonding 105, i.e., the semiconductor device.

On the figure of bonding object 105, indicated by 102 is a semiconductor chip which represents the power switching elements 30A, 30B, 32A, 32B, 40A, 40B, 42A and 42B, and 104 is a terminal which represents the output terminal 22 and negative terminal 24.

This wire bonding apparatus is characterized in the disposition, on the wire feed-through path, of the wire pre-forming mechanism 140 which deforms in advance the wire 101 of aluminum or aluminum alloy which includes silicon, nickel, etc. and with a diameter of the 100–600 µm range at a ratio of deformation factor W/D of around 2.0 or more (preferably 2.5 or more, or more preferably in the range from 4 to 6).

FIG. 6A is a cross-sectional view of the apparatus used to explain the wire pre-forming mechanism 140 shown in FIG. 5, and FIG. 6B is a cross-sectional view taken along the line C—C and seen along the direction D of FIG. 6A.

This wire pre-forming mechanism 140 includes molds 141 and 142 located below and above the wire 101, as shown in FIGS. 6A and 6B. The lower mold 141 and upper mold 142 are supported at the positions on both sides of the horn 110 so that they can move independently of the horn 110, as shown in FIG. 7 of another wire pre-forming mechanism 140A which will be explained later.

A cam 145, which is movable to the right and left on the drawing by a formation driving device 144, is disposed in contact with the upper mold 142 as shown in FIG. 6A. The driving device 144 moves the cam 145 to the left on the drawing so that the upper mold 142 is pushed down toward the fixed lower mold 141, thereby pressing the wire 101, which is then deformed in its cross section in accordance with the shape of the mold. The wire 101 is deformed to meet a deformation factor W/D of a ratio of around 2.0 or more, or preferably 2.5 or more, or more preferably in the range from 4 to 6.

In this embodiment, the lower mold 141 has a planar wire contact surface and the upper mold 142 has its wire contact surface formed to include a V-shaped profile, so that an excessive tensile stress which can break the wire 101 does not emerge in the wire center. This V-shaped profile of the upper mold 142 also serves to guide the wire 101 in its longitudinal and lateral directions. In addition, the upper mold 142 has its wire inlet and outlet formed to have rounded slope sections 149, so that the shearing stress acting on the ends of deformation section of the wire 101 is alleviated.

A variety of variant versions of the wire pre-forming mechanism 140 are conceivable to carry out the flatly thinner deformation of the wire 101 while avoiding a concentrated stress. Shown in FIG. 7 is a variant mechanism as an example.

Using the wire pre-forming mechanism 140, when the wire 101 having a diameter of 300 µm, for example, is deformed at a ratio of a deformation factor W/D of 2.0, it will become to have a thickness H of around 120 µm. The wire pre-forming mechanism 140 of this embodiment can be adjusted independently of the horn 110, so that the deformation factor W/D can be set arbitrarily. Specifically, when the wire 101 having a diameter of 300 µm, the thickness H will be around 100 µm by the process at W/D=2.5, it will be around 80 µm by the process at W/D=3.0, it will be around 70 µm by the process at W/D=3.5, it will be around 60 µm by the process at W/D=4.0, it will be around 50 µm by the process at W/D=5.0, and it will be around 40 µm at W/D=6.0.

For a wire diameter of 300 µm, when the ratio of the deformation factor W/D is set in the range from 4 to 6 so that the resulting thickness H will be around 40 to 60 µm, the above formula (4) suggests the significant improvement of the strength and life of the joint 100.

Figure 7:
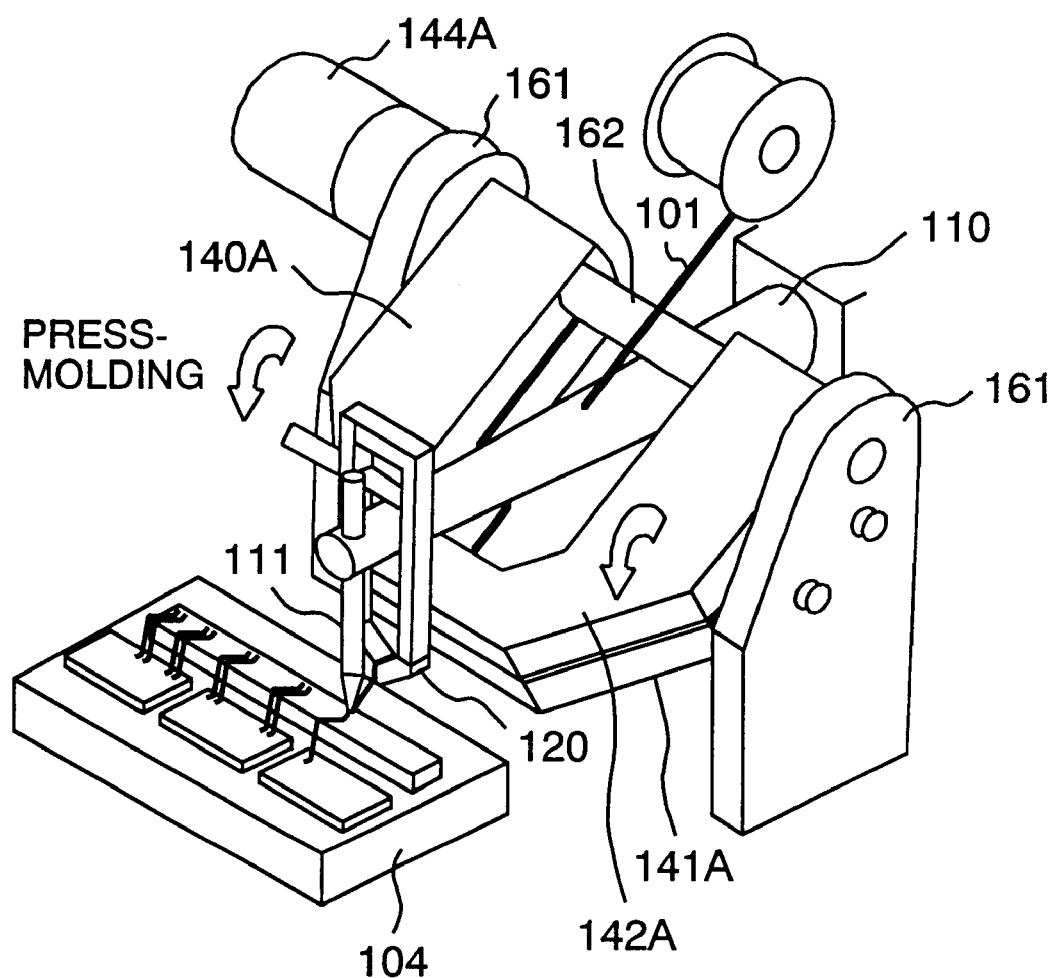
FIG. 7 is a brief perspective view of a wire bonding apparatus based on a second embodiment of this invention.

Although the wire pre-forming mechanism 140 of the foregoing embodiment uses the cam 145 to move the upper mold 142, variant versions include a swing motion mechanism as shown in FIG. 7 and an up/down motion mechanism.

FIG. 7 is a brief perspective view of the wire bonding apparatus based on the second embodiment of this invention. The wire pre-forming mechanism 140A of this embodiment includes a lower mold 141A which is fixed obliquely to a side frame 161, an upper mold 142A which is fixed on a shaft 162 pivoted on the side frame 161 so that the upper mold 142A can have a swing motion, and a swing drive device 144A including a servo motor for driving the upper mold 142A to swing about the shaft 162.

The lower mold 141A and upper mold 142A have the same formation on their wire contact surfaces as those of the lower mold 141 and upper mold 142 of the previous embodiment shown in FIGS. 6A and 6B.

In operation, in contrast to the embodiment shown in FIG. 6A in which the driving device 144 moves the cam 145 straight so that the upper mold 142 is pushed down thereby to press the wire 101 to deform, the embodiment shown in FIG. 7 is designed such that the swing drive device 144A directly drives the upper mold 142A to swing thereby to press the wire 101 to deform.

According to the foregoing embodiments, in which the wire pre-forming mechanisms 140 and 140A are employed for implementing the flatly thinner deformation of the wire 101, it is possible to shape the wire press section 112 of the bonding tool 111 to the upper molds 142 and 142A, so that the joint area becomes wide enough for stable wire bonding to take place.

Figure 8A:
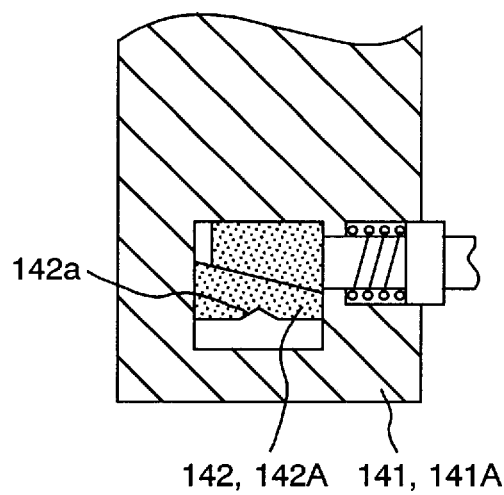
FIGS. 8A and 8C are cross-sectional views of the apparatus used to explain the wire pre-forming mechanisms.
Figure 8B:
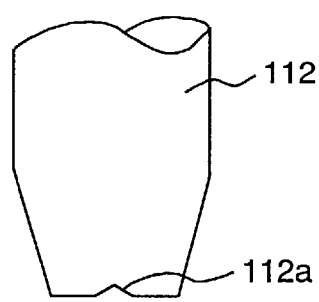
FIGS. 8B and 8D are side views of the wire press section at the tip of the respective wire bonding tools.
Figure 8C:
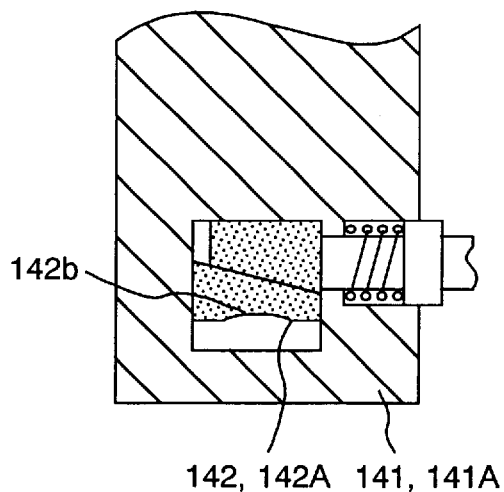
Figure 8D:
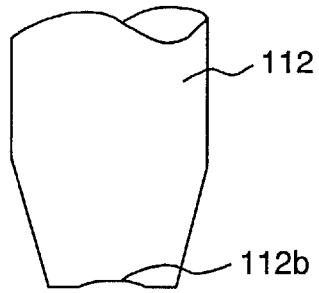

FIGS. 8A and 8C are cross-sectional views of two embodiments of wire pre-forming mechanism, and FIGS. 8B and 8D are side views of the wire press section located at the tip of the wire bonding tool. Specifically, FIGS. 8A and 8C show a V-shaped groove 142a and flat groove 142b formed on the upper mold 142 (142A) of the pre-forming mechanism 140 (140A), and FIGS. 8B and 8D show a V-shaped groove 112a and flat groove 112b formed on the wire press section 112 of the bonding tool 111. Namely, the bonding tool 111 which presses the wire 101 (not shown) has its wire press section 112 at the tip rendered the virtually same formation of the V-shaped groove 112a or flat groove 112b as the groove 142a or 142b of the upper mold 142 (142A) of the pre-forming mechanism 140 (140A), so that the joint area becomes wide enough for stable wire bonding to take place.

Next, the operation of the inventive wire bonding apparatus equipped with the wire pre-forming mechanism 140 (140A) will be explained with reference to FIGS. 9A–9C and FIGS. 10A and 10B.

Figure 9A:
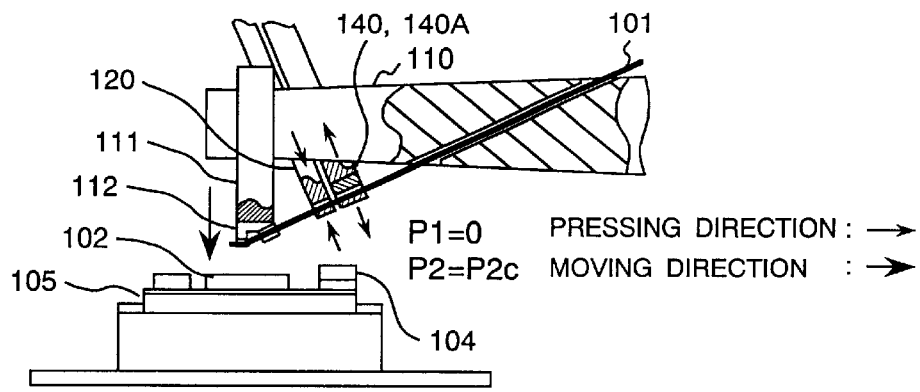
FIGS. 9A, 9B and 9C are partially cross-sectional side views of the inventive wire bonding apparatus used to explain the first operation.
Figure 9B:
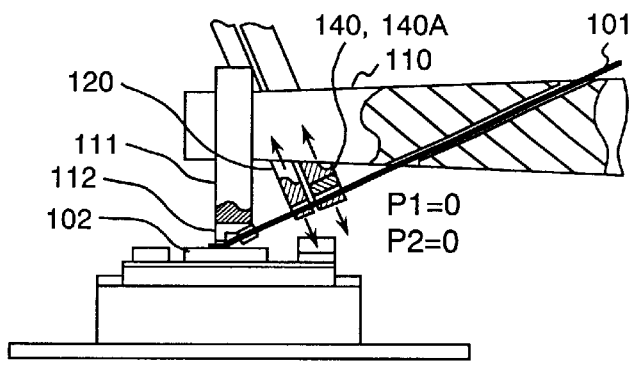
Figure 9C:
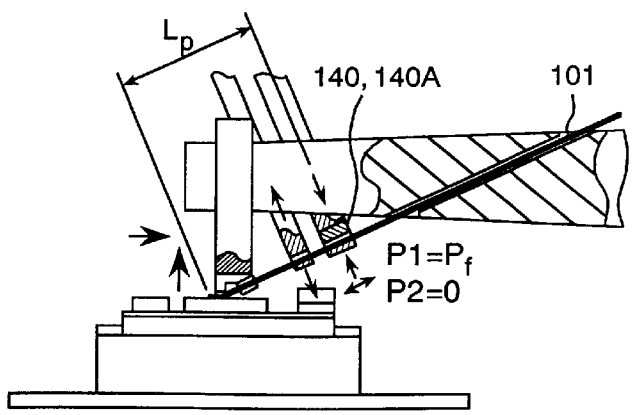

FIGS. 9A–9C are partially cross-sectional side views of the inventive wire bonding apparatus used to explain the first operation. The wire clamp mechanism 120 is adapted to hold the wire 101 and allow it to run in its longitudinal direction. The wire pre-forming mechanism 140 (140A) is located on the wire feed path by being aligned to the wire clamp mechanism 120.

First, the operation of wire bonding apparatus for joining the wire 101 to the first target joint surface based on the inventive wire bonding method will be explained with reference to FIGS. 9A–9C.

The wire 101 which has been deformed by the pre-forming mechanism 140 (140A) and fed out is positioned at its deformed section to the wire press section 112 of the bonding tool 111, and the wire clamp mechanism 120 is operated to hold the wire 101 so that the wire movement relative to the bonding tool 111 stops, as shown in FIG. 9A. In this state, the pre-forming pressure P1 exerted by the pre-forming mechanism 140 (140A) on the wire 101 is zero, while the wire clamp mechanism 120 exerts a wire clamping pressure P2=P2c on the wire 101 to hold it.

Subsequently, the bonding tool 111 and the target joint surface of the wire bonding object 105, i.e., the electrode 102A of the semiconductor chip 102, are moved relatively in the vertical and horizontal directions, so that deformed section of the wire 101 is positioned to the target joint surface.

Subsequently, the wire press section 112 at the tip of the bonding tool 111 presses the deformed wire 101 onto the target joint surface, i.e., the electrode 102A of the semiconductor chip 102, with vibration being applied, so that both members undergo ultrasonic bonding as shown in FIG. 9B. In this state, the wire 101 is free from the clamping force of the wire clamp mechanism 120 of the pre-forming mechanism 140 (140A), i.e., the pressures P1 and P2 are both zero.

Subsequently, the pre-forming mechanism 140 (140A) is moved along the wire feed path 116 to the position which matches with the prescribed wire length Lp along the finished wire loop measured from the wire joint, as shown in FIG. 9C. The driving device 144 (144A) shown in FIG. 6 (FIG. 7) is activated to exert a pressure P2=Pf on the wire 101 between the lower mold 141 (141A) and upper mold 142 (142A) shown in FIG. 8A (FIG. 8C), thereby deforming the wire 101 in its cross section. At this time, the wire clamp mechanism 120 in not holding the wire 101.

In this case, the pre-forming mechanism 140 (140A) deforms the wire 101 for the amount of two joint sections at once, since both ends of each piece of wire are always bonded. A groove may be formed at the end or middle of the deformed section of the wire 101 so that it can be cut easily.

Figure 10A:
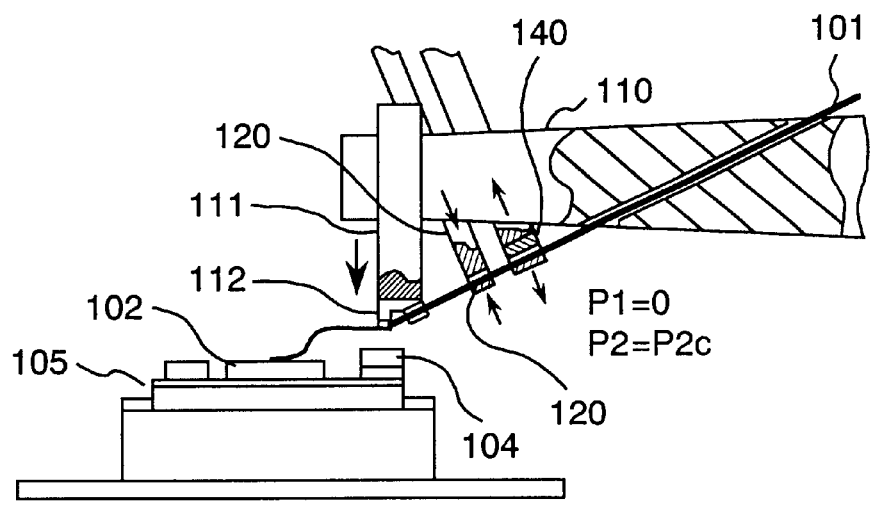
FIGS. 10A and 10B are side views of the inventive wire bonding apparatus used to explain the second operation.
Figure 10B:
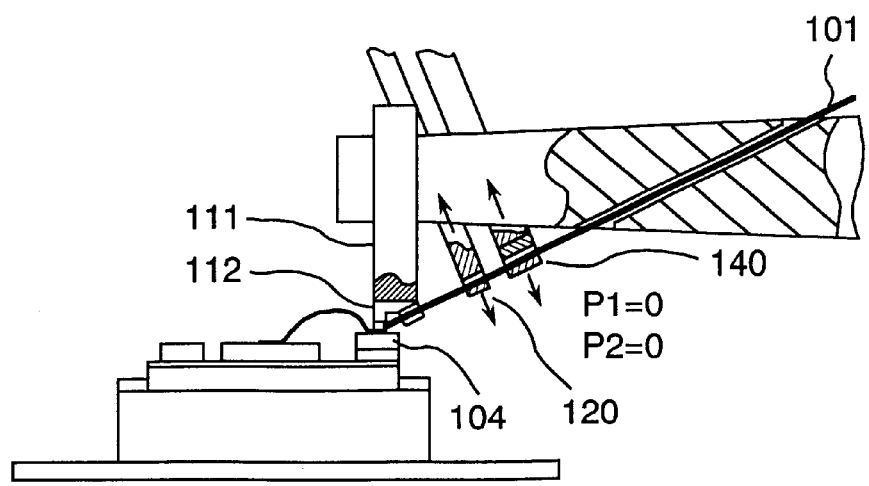

Next, the operation of wire bonding apparatus for joining the wire 101 to the second target joint surface based on the inventive wire bonding method will be explained with reference to FIGS. 10A and 10B. FIGS. 10A and 10B are side views of the wire bonding apparatus used to explain the second operation of the apparatus based on this invention.

Shown in FIG. 10A is the state of the apparatus after the wire 101 has been joined to the first target joint surface 102A. The wire 101 is released from the molds 141 and 142 of the pre-forming mechanism 140 (140A), and the bonding tool 111 is moved to the next target joint surface of the electrode 104 along the predetermined wire loop, and, as a result, the wire 101 is positioned at its deformed section to the wire press section 112.

The wire clamp mechanism 120 exerts a pressure P2=P2c on the wire 101 to hold it thereby to stop its movement relative to the bonding tool 111. In this state, the wire press section 112 presses the deformed wire 101 onto the electrode 104, with vibration being applied, as shown in FIG. 10B, so that ultrasonic wire bonding takes place in the same manner as the previous bonding process. With the wire 101 being clamped, the wire clamp mechanism 120 is moved together with the bonding tool 111 to retreat from the joint surface, and the wire 101 is cut off.

Based on the deformation of both ends of the wire 101 to match with the wire loop by the pre-forming mechanism 140 (140A) prior to the joining process, it becomes possible to accomplish the wire bonding of enhanced joint strength and life N resulting from the wider joint area.

Although in the foregoing embodiments, the wire pre-forming mechanisms 140 and 140A are equipped independently of the wire clamp mechanism 120, an alternative design is to eliminate the wire clamp mechanism 120 and use the wire pre-forming mechanism 140 (140A) to clamp and deform the wire 101. Although in the foregoing embodiments, the wire pre-forming mechanisms 140 and 140A are movable relative to the wire clamp mechanism 120, both devices may be moved as a unitary member.

Next, the joint surface of the electrode 102A and wire 101 will be explained with reference to FIGS. 11A and 11B. FIG. 11A is a partially cross-sectional perspective view showing the joint of the wire joint section and target joint surface based on this invention, and FIG. 11B is a cross-sectional view taken along the line B—B of FIG. 11A.

For a high-power semiconductor device, the wire 101 of aluminum or aluminum alloy which includes silicon, nickel, etc. and with a diameter D of the 100–600 $\mu$m range, as shown in FIG. 11B, is used. The wire 101 is deformed in advance by the wire pre-forming mechanism 140 (140A) at a ratio of deformation factor W/D of around 2.0 or more, or preferably 2.5 or more, or more preferably in the range from 4 to 6. The deformed wire 101 is brought in contact with the electrode 102A and joined to it by ultrasonic wire bonding with no risk of damage to the semiconductor chip 102.

As compared with the conventional wire bonding, in which the bonding conditions including the ultrasonic output, pressing force and their application time length are optimized to such an extent that the semiconductor chip 102 is not damaged and a wire thickness H of 200 $\mu$m is achieved for a wire diameter D of 300 $\mu$m at a ratio of a deformation factor W/D of about 1.3, the inventive wire bonding method and apparatus are capable of reducing drastically the deformed wire thickness in terms of H1/H2, where H1 and H2 are the inventive and conventional thickness, to around 0.6 or less, or hopefully around 0.5 or less, or more hopefully in the range from 0.3 to 0.2. Consequently, based on the formula (4), the inventive wire bonding method and apparatus are capable of enhancing the strength and life of wire joint attributable to power cycles by 2-fold or more, or hopefully 2.5-fold or more, or more hopefully in the range from 5 to 9-fold.

Figure 12:
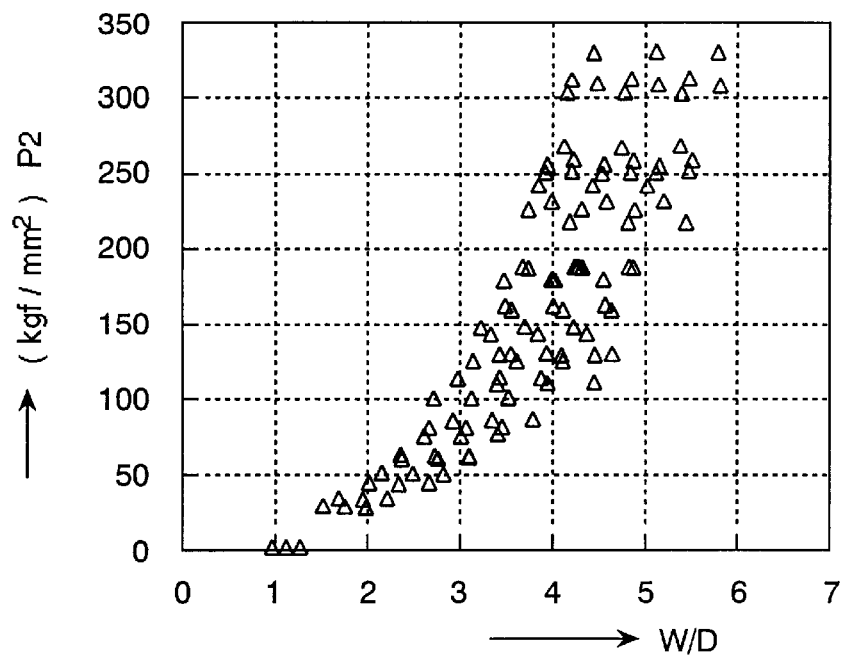
FIG. 12 is a characteristic graph showing the relation between the forming pressure exerted on a wire and the resulting deformation factor.

FIG. 12 is a characteristic graph showing the relation between the forming pressure P1 (kg f/mm$^2$) exerted on an aluminum wire having a diameter D of 300 $\mu$m plotted along the vertical axis and the deformation factor W/D after deforming process plotted along the horizontal axis. The graph suggests that achieving W/D=3 requires a forming pressure of about 50–100 kg f/mm$^2$, and exerting such a large pressure during the wire joining process will damage a semiconductor chip or electronic part. Whereas, the inventive wire bonding method and apparatus can exert the large forming pressure on the wire 101 by means of the pre-forming mechanisms 140 and 140A.

A consequent large wire deformation factor W/D based on the inventive wire bonding method and apparatus reduces the wire thickness to 0.6 or less in terms of H1/H2, where H1 and H2 are the inventive and conventional thickness, as mentioned previously. The smaller wire thickness ratio H1/H2 signifies the extension of joint life attributable to power cycles as shown in FIG. 13.

Figure 13:
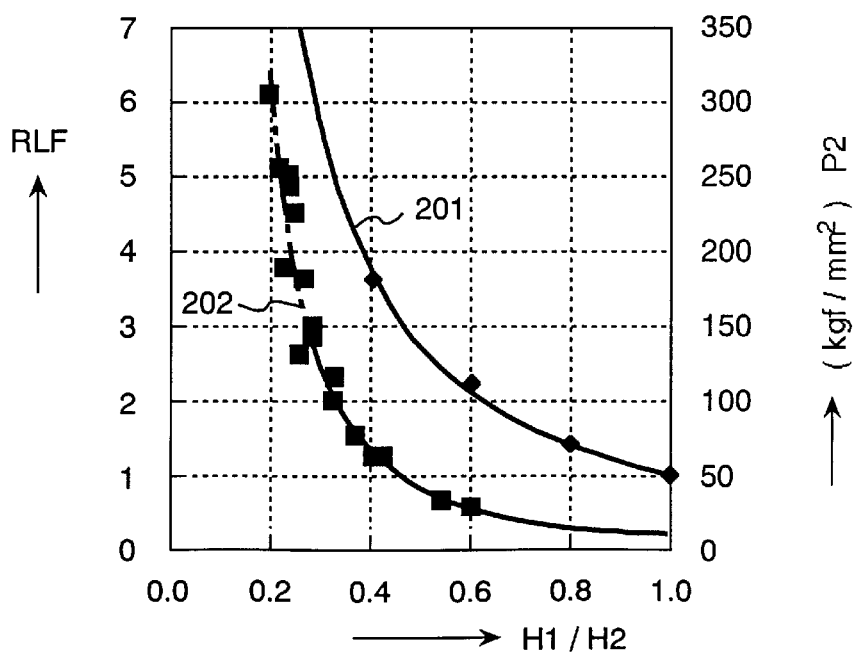
FIG. 13 is a characteristic graph showing the joint life of aluminum wire attributable to power cycles and the forming pressure plotted against the ratio of the inventive wire thickness to the conventional wire thickness.
Figure 14:
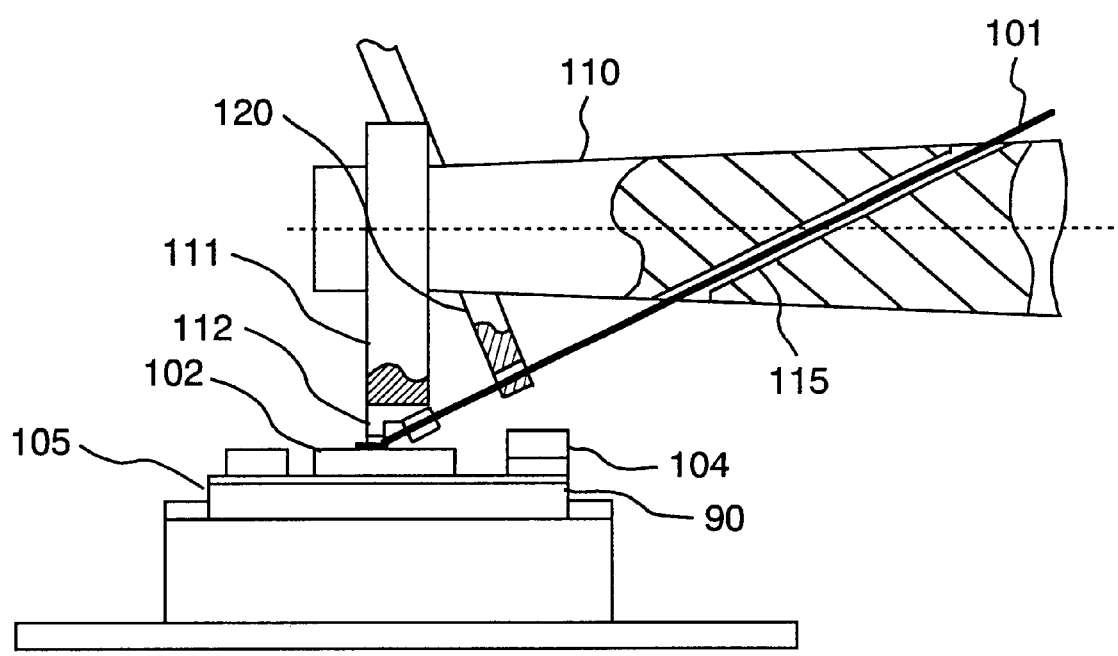
FIG. 14 is a side view of the conventional wire bonding apparatus.

FIG. 13 is a characteristic graph showing the joint life of aluminum wire attributable to power cycles and the forming pressure plotted against the ratio of the inventive wire thickness to the conventional wire thickness. On this graph, the ratio of the inventive and conventional wire thickness H1/H2 is plotted along the horizontal axis, the ratio of the inventive and conventional joint life (RLF) resulting from cyclic power applications to the wire is plotted along the first vertical axis to draw a curve 201, and the forming pressure P2 exerted on the aluminum wire is plotted along the second vertical axis to draw a curve 202.

The graph reveals that the smaller the wire thickness ratio H1/H2, the more extended is the joint life, and also suggests that an increased forming pressure is required to make the wire 101 thinner.

The inventive wire bonding method and apparatus are capable of reducing the wire thickness by the provision of the wire pre-forming mechanism, and thus extending the wire joint life attributable to power cycles, and the inventive high-power semiconductor device is durable against severe heat cycles and power cycles thereby to last long, while yet being compact and light-weight.

Although the present invention has been explained specifically for the case of wire-bonding a high-power semiconductor device, it is also applicable to wire-bonding of other semiconductor devices and electronic components.

The inventive wire bonding method and apparatus are capable of increasing the joint area between the wire and target joint surface without the burden of an excessive ultrasonic output, forming pressure and their application time length at the wire joining process. Consequently, it becomes possible to enhance the wire joint strength, and accomplish semiconductor devices and electronic components having improved life against severe heat cycles and power cycles.

Particularly, the inventive wire bonding method and apparatus are designed to deform the wire in advance, so that ultrasonic output, forming pressure and their application time length can be reduce at the wire joining process, whereby it becomes possible to prevent the breakage of semiconductor chips and other electronic parts and accomplish reliable semiconductor devices and electronic components.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A semiconductor device having a wire joint surface of semiconductor chip, to which is joined a wire by ultrasonic wire bonding with the prior rendition of flatly thinner plastic deformation for the joint section of the wire at a ratio of 2 or more in terms of deformation factor W/D, where W is the width of deformed wire at the joint section and D is the original wire diameter.

2. A semiconductor device according to claim 1, wherein said wire diameter D ranges from 100 to 600 μm.

3. A semiconductor device according to claim 1, wherein the wire is made of aluminum or aluminum alloy.

4. A semiconductor device having a wire joint surface of semiconductor chip, to which is joined a wire by ultrasonic wire bonding with the prior rendition of flatly thinner plastic deformation for the joint section of the wire at a ratio in the range from 4 to 6 in terms of deformation factor W/D, where W is the width of deformed wire at the joint section and D is the original wire diameter.

5. A semiconductor device according to claim 4, wherein said wire diameter D ranges from 100 to 600 μm.

6. A semiconductor device according to claim 4, wherein the wire is made of aluminum or aluminum alloy.

7. A semiconductor device comprising a high-power semiconductor device which includes:

a positive terminal and an output terminal which are fixed on an insulation substrate;

a first power element and a second diode which are joined to said positive terminal, and a second power element and a first diode which are joined to said output terminal; and a negative terminal which is fitted on said insulation substrate through an insulator, said first power element having its emitter electrode connected to said output terminal by wire bonding, said second diode having its anode electrode connected to said output terminal by wire bonding, said second power element having its emitter electrode connected to said negative terminal by wire bonding, and said first diode having its anode electrode connected to said negative terminal by wire bonding, wherein wires to be joined by ultrasonic wire bonding to the joint surfaces of said first and second power elements and said first and second diodes are rendered at the joint sections thereof with flatly thinner plastic deformation at a ratio of 2 or more in terms of deformation factor W/D, where W is the width of deformed wire at the joint section and D is the original wire diameter.

8. A semiconductor device according to claim 7, wherein said wire diameter D ranges from 100 to 600 μm.

9. A semiconductor device according to claim 7, wherein the wire is made of aluminum or aluminum alloy.

10. A semiconductor device according to claim 7, wherein said wires to be joined by ultrasonic wire bonding to the joint surfaces of said first and second power elements and said first and second diodes have undergone the flatly thinner plastic deformation from the original wire diameter prior to joining to the joint surfaces by the ultrasonic bonding.

11. A semiconductor device comprising a high-power semiconductor device which includes:

a positive terminal and an output terminal which are fixed on an insulation substrate;

a first power element and a second diode which are joined to said positive terminal, and a second power element and a first diode which are joined to said output terminal; and a negative terminal which is fitted on said insulation substrate through an insulator, said first power element having its emitter electrode connected to said output terminal by wire bonding, said second diode having its anode electrode connected to said output terminal by wire bonding, said second power element having its emitter electrode connected to said negative terminal by wire bonding, and said first diode having its anode electrode connected to said negative terminal by wire bonding, wherein wires to be joined by ultrasonic wire bonding to the joint surfaces of said first and second power elements and said first and second diodes are rendered at the joint sections thereof with flatly thinner plastic deformation at a ratio in the range from 4 to 6 in terms of deformation factor W/D, where W is the width of deformed wire at the joint section and D is the original wire diameter.

12. A semiconductor device according to claim 11, wherein said wire diameter D ranges from 100 to 600 μm.

13. A semiconductor device according to claim 11, wherein the wire is made of aluminum or aluminum alloy.

14. A semiconductor device according to claim 11, wherein said wires to be joined by ultrasonic wire bonding to the joint surfaces of said,first and second power elements and said first and second diodes have undergone the flatly thinner plastic deformation from the original wire diameter prior to joining to the joint surfaces by the ultrasonic bonding.

* * * * *